(12) United States Patent
Hwang

(10) Patent No.: US 8,988,961 B2
(45) Date of Patent: Mar. 24, 2015

(54) SELF-REFRESH CONTROL CIRCUIT AND MEMORY INCLUDING THE SAME

(75) Inventor: Jeong-Tae Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 395 days.

(21) Appl. No.: 13/525,885

(22) Filed: Jun. 18, 2012

(65) Prior Publication Data

US 2013/0003482 A1  Jan. 3, 2013

(30) Foreign Application Priority Data

Jun. 29, 2011  (KR) .......................... 10-2011-0063563

(51) Int. Cl.
*G11C 7/00* (2006.01)
*G11C 11/406* (2006.01)

(52) U.S. Cl.
CPC .... G11C 11/40615 (2013.01); G11C 11/40611 (2013.01); *G11C 2211/4067* (2013.01)

USPC ................. 365/222; 365/185.15; 365/230.06; 365/149

(58) Field of Classification Search
CPC ................... G11C 11/40615; G11C 11/40611; G11C 11/4063; G11C 11/403
USPC ........................ 365/222, 185.15, 230.06, 149
See application file for complete search history.

(56) References Cited

U.S. PATENT DOCUMENTS

| | | | | |
|---|---|---|---|---|
| 5,894,446 A | * | 4/1999 | Itou | ................................ 365/222 |
| 6,310,819 B1 | * | 10/2001 | Cowles et al. | ............ 365/230.06 |
| 2007/0230265 A1 | * | 10/2007 | Riho et al. | ..................... 365/222 |

* cited by examiner

*Primary Examiner* — Han Yang
(74) *Attorney, Agent, or Firm* — IP&T Group LLP

(57) ABSTRACT

An self-refresh control circuit for controlling a self-refresh operation of a memory device includes a self-refresh control logic block configured to control the memory device to perform the self-refresh operation and an initial refresh control block configured to activate the self-refresh control logic block in an initialization period of the memory device.

11 Claims, 4 Drawing Sheets

SELF-REFRESH CONTROL CIRCUIT AND MEMORY INCLUDING THE SAME

CROSS-REFERENCE TO RELATED APPLICATIONS

The present application claims priority of Korean Patent Application No. 10-2011-0063563, filed on Jun. 29, 2011, which is incorporated herein by reference in its entirety.

BACKGROUND

1. Field

Exemplary embodiments of the present invention relate to a memory, and more particularly, to a self-refresh operation of a memory.

2. Description of the Related Art

A memory device receives diverse setup values and sets up operation timings in order to start an operation thereof after a power is supplied and then a certain time passes until the power supply is stabilized.

FIG. 1 illustrates an initialization process of a Double Data Rate 3 (DDR3) Synchronous Dynamic Random Access Memory (SDRAM) device.

Referring to FIG. 1, a power supply voltage VDD and VDDQ is supplied, and a reset signal RESETB (which is a signal for resetting diverse circuits in a chip) is enabled to a logic low level to initialize the values of the various internal circuits, such as latch circuits, of a memory device. After such an initialization process is finished, i.e., at a '101' moment, a clock enable signal CKE is enabled to a logic high level to start synchronous operations of the memory device and set various values MRS and MR based on the values applied as a command COMMAND and a bank address BA.

In FIG. 1, 'CK' denotes a clock, 'CK#' denotes an inverted clock, and 'CKE' denotes a clock enable signal, which is a signal indicating a period where a memory device is to operate in synchronization with a clock. Also, 'MRS' and 'MR#' indicate diverse setup values set up in the memory device. A part marked with oblique lines represents a "Don't Care" period. In FIG. 1, 'tXPR' denotes a reset CLE exit time; 'tMRD' denotes a cycle time of a mode register set (MRS) command; 'tMOD' denotes a delay time from an MRS command to a non-MRS command; and 'tZQinit' denotes an initial ZQ calibration time. The tXPR, tMRD, tMOD, and tZQinit may be parameters defined in a standard memory specification, i.e., Joint Electron Device Engineering Council (JEDEC) Specification.

Since the memory device does not perform any other operation therein during the initialization operation, the operations of the internal circuits in the memory device may not be stabilized. That is, when the power-up of a system using a memory device is relatively fast or a power supply voltage is undesirably instable, the internal circuits of the memory device may be instable at a booting, which may cause the operation of the memory device to malfunction.

SUMMARY

Exemplary embodiments of the present invention are directed to stabilizing the operations of internal circuits of a memory device in a process of initializing the memory device.

In accordance with an exemplary embodiment of the present invention, an self-refresh control circuit for controlling a self-refresh operation of a memory device includes a self-refresh control logic block configured to control the memory device to perform the self-refresh peration, and an initial refresh control block configured to activate the self-refresh control logic block in an initialization period of the memory device.

In accordance with another exemplary embodiment of the present invention, a method for controlling a self-refresh operation of a memory device includes starting a self-refresh operation in response to a reset signal for an initialization operation of the memory device, and ending the self-refresh operation in response to a clock enable signal for a synchronization operation of the memory device.

In accordance with yet another exemplary embodiment of the present invention, a memory device includes a cell array including a plurality of memory cells, a row circuit configured to control a row operation of the cell array, a command decoding block configured to generate a self-refresh initiation signal and a self-refresh termination signal by decoding a command, an initial refresh control block configured to generate a self-refresh period signal that is activated in an initialization period of the memory device, and a self-refresh control logic block configured to control the row circuit to perform a self-refresh operation in an activation period of the self-refresh period signal and a period from a moment when the self-refresh initiation signal is activated to a moment when the self-refresh termination signal is activated.

DETAILED DESCRIPTION

Figure 1:
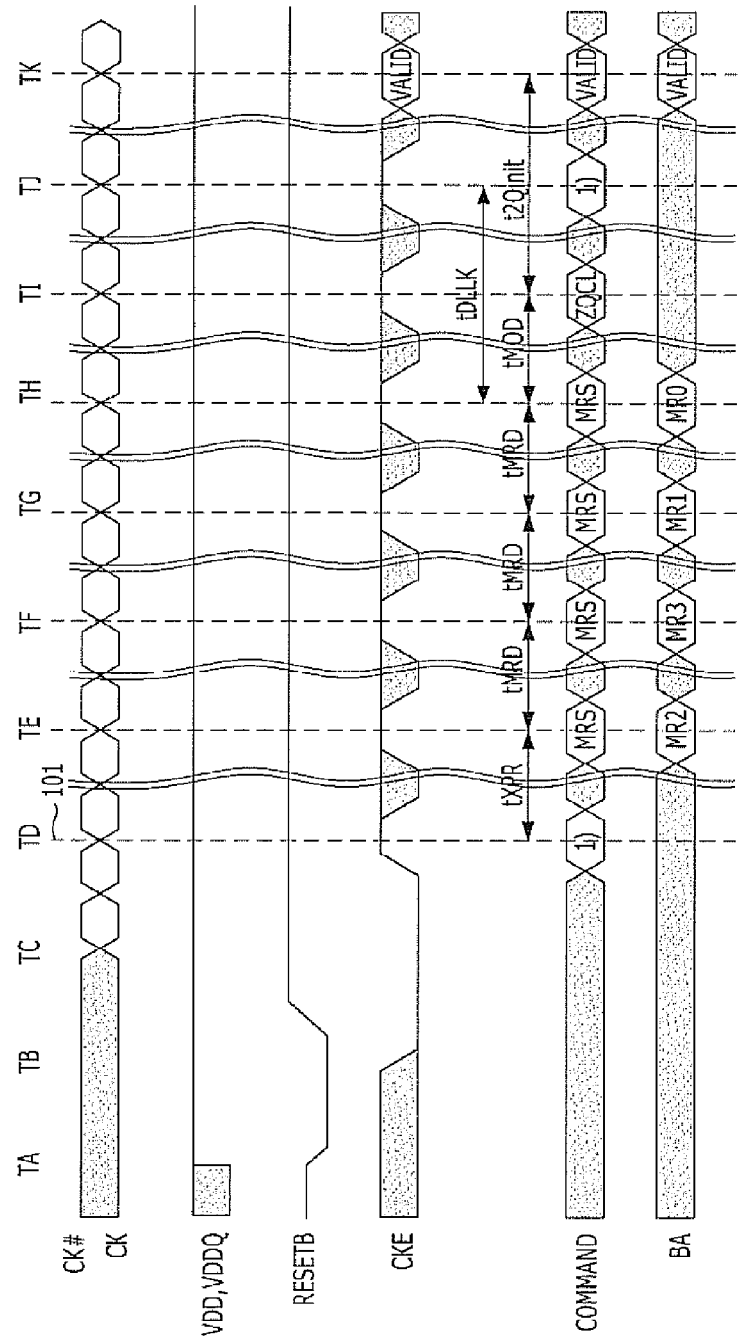
FIG. 1 is a timing diagram showing an initialization process of a Double Data Rate 3 (DDR3) Synchronous Dynamic Random Access Memory (SDRAM) device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In accordance with an exemplary embodiment of the present invention is that a memory performs a self-refresh operation during the initialization operation of a memory device. Hereafter, the self-refresh operation will be described in detail.

A memory device includes a capacitor as a unit device for storing a data, and an access transistor. Here, the capacitor is referred to as a cell. When a data of '1' is stored in a cell, a high voltage level is applied to the cell. When a data of '0' is stored in a cell, a low voltage level is applied to the cell. Ideally, a capacitor always maintains the charges previously accumulated therein as long as the voltage level of a coupling terminal of the capacitor is not changed. In reality, however, a capacitor loses the charges previously stored therein in the form of leakage current as time passes and the data stored in the capacitor is not distinguished between the data of '1' and '0'. Therefore, a process of sensing the data stored in a cell and storing the data again periodically is to be performed in order to continuously maintain the data. A series of these processes are referred to as a refresh operation. A refresh process includes an auto-refresh operation and a self-refresh operation. The auto-refresh operation is a refresh operation that is performed in response to a command applied from a memory controller (An active operation of the memory device is performed once for one command). The self-refresh operation is a refresh operation that is performed by the memory device for itself when the memory controller informs the memory of a self-refresh period (The memory device performs the active operation in several times for itself in a self-refresh mode).

Figure 2:
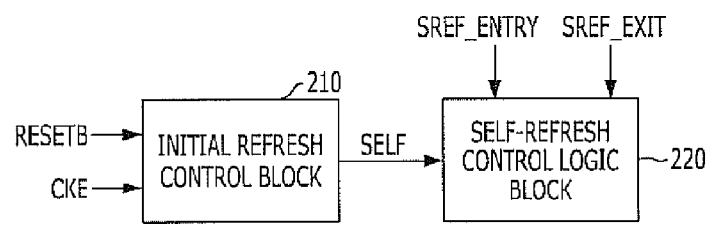
FIG. 2 is a block diagram illustrating a self-refresh control circuit of a memory device in accordance with an exemplary embodiment of the present invention.

FIG. 2 is a block diagram illustrating a self-refresh control circuit of a memory device in accordance with an exemplary embodiment of the present invention.

Referring to FIG. 2, the self-refresh control circuit includes an initial refresh control block 210 and a self-refresh control logic block 220.

The self-refresh control logic block 220 controls a memory device to perform a self-refresh operation in a self-refresh period. The self-refresh period includes 1) a period from a moment when a self-refresh initiation signal SREF_ENTRY is enabled to a moment when a self-refresh termination signal SREF_EXIT is enabled (which is substantially similar to the conventional technology), and 2) a period where a self-refresh period signal SELF is enabled (which is described as an exemplary embodiment of the present invention), Controlling the memory device to perform a self-refresh operation means controlling the memory device to perform an active operation by changing a row address internally. Performing an active operation by changing a row address means sequentially enabling a plurality of word lines in the memory device and amplifying the data of memory cells controlled by the enabled word lines through a bit line sense amplifier. Since such a self-refresh operation control of the self-refresh control logic block 220 is well known to those of ordinary skill in the art to which the present invention pertains, further descriptions on it is omitted herein.

The initial refresh control block 210 controls the self-refresh control logic block 220 to be enabled during an initialization period of the memory device so that the self-refresh control logic block 220 may control the memory device to safely perform the self-refresh operation. Here, the initialization period of the memory device may be included within a period from a moment when the memory device is powered up to a moment when the memory device begins to be synchronized with a clock. Specifically, the initial refresh control block 210 enables the self-refresh period signal SELF from a moment when a reset signal RESETB is disabled to a moment when a clock enable signal CKE is enabled during the initialization operation of the memory device so that the memory device performs a self-refresh operation.

When the self-refresh operation is performed during the initialization operation, various circuits in the memory device operate as well, thus stabilizing the operation of the circuits and the voltage used by the internal circuits of the memory device. Therefore, the memory device may be prevented from malfunctioning after the initialization operation.

Here, the reset signal RESETB is a signal for initializing the initial values of the internal circuits of the memory device, such as a latch circuit, and the clock enable signal CKE represents a period where the memory device operates in synchronization with a clock.

Figure 3:
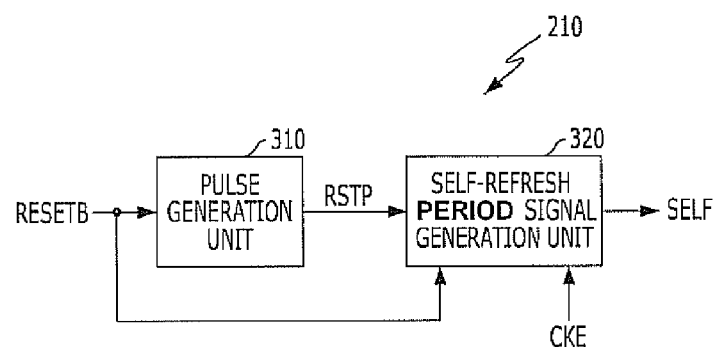
FIG. 3 is a block diagram of an initial refresh control block shown in FIG. 2.

FIG. 3 is a block diagram of an initial refresh control block 210 shown in FIG. 2.

Referring to FIG. 3, the initial refresh control block 210 includes a pulse generation unit 310 and a self-refresh period signal generation unit 320.

The pulse generation unit 310 generates a reset pulse RSTP that is enabled when the reset signal RESETB transitions from an enable state to a disable state. Since the reset signal RESETB is a signal that is enabled to a logic low level, the pulse generation unit 310 enables the reset pulse RSTP to a logic high level when the reset signal RESETB transitions from a logic low level to a logic high level.

The self-refresh period signal generation unit 320 enables/activates the self-refresh period signal SELF in response to the enabling of the reset pulse RSTP and disables/deactivates the self-refresh period signal SELF in response to an enabling of the clock enable signal CKE.

Figure 4:
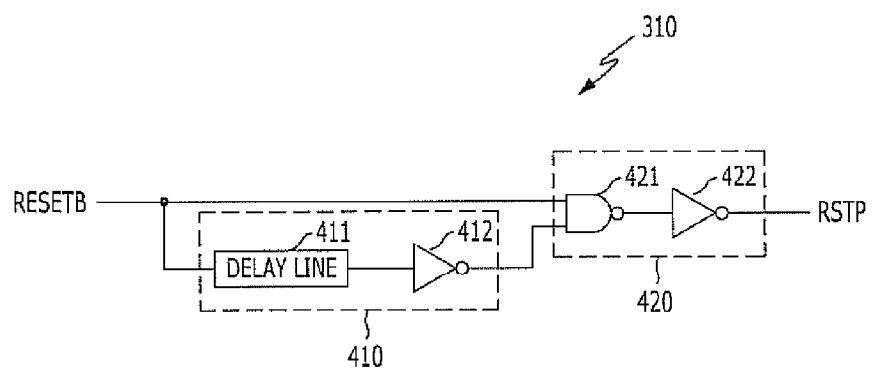
FIG. 4 is a block diagram of a pulse generation unit shown in FIG. 3.

FIG. 4 is a block diagram of the pulse generation unit 310 shown in FIG. 3.

Referring to FIG. 4, the pulse generation unit 310 includes an inversion delay line 410 for inverting and delaying the reset signal RESETB and a reset pulse generation unit 420 for generating the reset pulse RSTP by logically combining an output signal of the inversion delay line 410 and the reset signal RESETB.

The inversion delay line 410 delays the reset signal RESETB by a delay line 411 and inverts the delayed reset signal by an inverter 412.

The reset pulse generation unit 420 includes a NAND gate 421 and an inverter 422. The reset pulse generation unit 420 enables the reset pulse RSTP to a logic high level, when an output signal of the inversion delay line 410 and the reset signal RESETB are all in a logic high level, and outputs the enabled reset pulse RSTP. After all, the reset pulse RSTP becomes a pulse signal that is enabled when the reset signal RESETB transitions from a logic low level to a logic high level.

Figure 5:
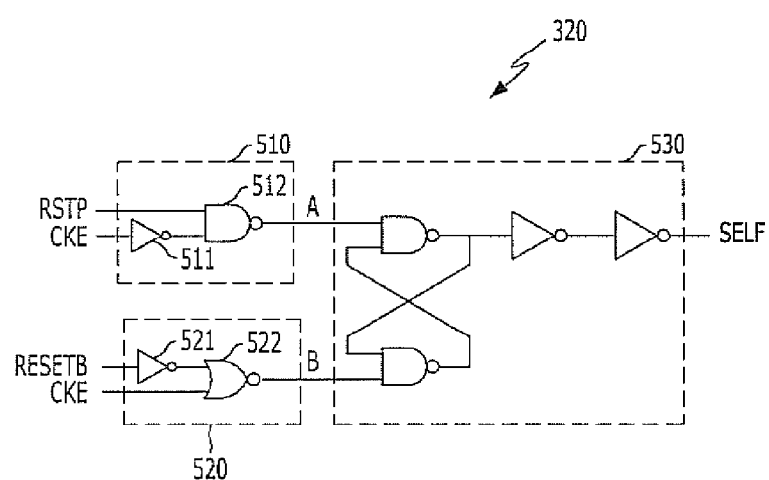
FIG. 5 is a block diagram of a self-refresh period signal generation unit shown in FIG. 3.

FIG. 5 is a block view of a self-refresh period signal generation unit 320 shown in FIG. 1

Referring to FIG. 5, the self-refresh period signal generation unit 320 includes a first signal generator 510, a second signal generator 520, and a Set-Rest (SR) latch 530.

The first signal generator 510 includes an inverter 511 and a NAND gate 512. The first signal generator 510 enables a first signal A to a logic low level in a period where the reset pulse RSTP is enabled to a logic high level and the clock enable signal CKE is disabled to a logic low level.

The second signal generator 520 includes an inverter 521 and a NOR gate 522. The second signal generator 520 enables a second signal B to a logic low level when the reset signal RESETB is enabled to a logic low level or the clock enable signal CKE is enabled to a logic high level.

Figure 6:
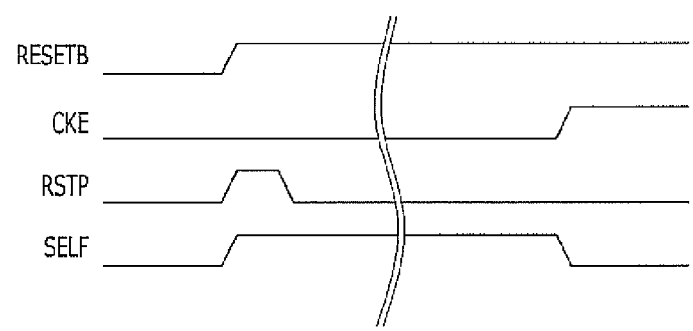
FIG. 6 is a timing diagram illustrating the operation of circuits shown in FIGS. 2 to 5.

The SR latch 530 enables the self-refresh period signal SELF to a logic high level when the first signal A is enabled to a logic low level, and when the second signal B is enabled to a logic low level, the SR latch 530 disables the self-refresh period signal SELF to a logic low level, FIG. 6 is a timing diagram illustrating the operation of circuits shown in FIGS. 2 to 5.

Referring to FIG. 6, the reset signal RESETB of the memory device is enabled to a logic low level, and therefore, the initial values of the internal circuits of the memory device are set. When the reset signal RESETB that is enabled to a logic low level is disabled to a logic high level, the reset pulse RSTP is enabled to a logic high level in response to the disabling of the reset signal RESETB. In response to the reset pulse RSTP that is enabled to a logic high level, the self-refresh period signal SELF is enabled to a logic high level, and while the self-refresh period signal SELF is enabled, a self-refresh operation of the memory device is performed by the self-refresh control logic block 220.

Subsequently, when the clock enable signal CKE is enabled to a logic high level, the self-refresh period signal SELF is disabled to a logic low level in response to the enabling of the clock enable signal CKE. As a result, the self-refresh operation is ended. After the clock enable signal CKE is enabled to a logic high level, the memory device operates in synchronization with a clock, receives a command, and performs an operation corresponding to the command.

Figure 7:
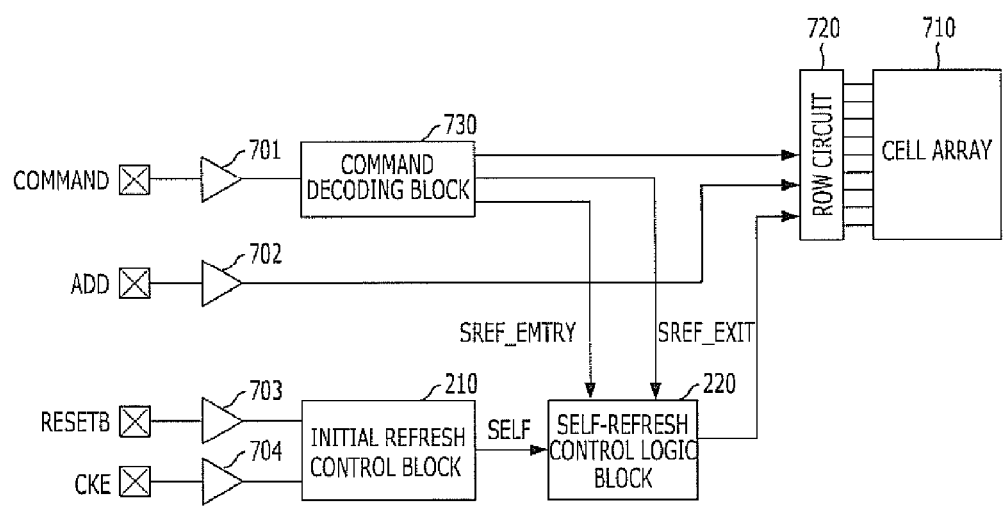
FIG. 7 is a block diagram illustrating a memory device including a self-refresh control circuit shown in FIG. 2 in accordance with an exemplary embodiment of the present invention.

FIG. 7 is a block diagram illustrating a memory device including a self-refresh control circuit shown in FIG. 2 in accordance with an embodiment of the present invention. The drawings show structure that are related to a row operation (which includes an active operation and a refresh operation) of the memory device.

Referring to FIG. 7, the memory device includes a cell array 710, a row circuit 720, a command decoding block 730, an initial refresh control block 210, and a self-refresh control logic block 220. The cell array 710 includes a plurality of memory cells. The row circuit 720 controls a row operation of the cell array 710. The command decoding block 730 generates a self-refresh initiation signal SREF_ENTRY and a self-refresh termination signal SREF_EXIT by decoding a command COMMAND. The initial refresh control block 210 generates a self-refresh period signal SELF that is enabled during the initialization operation of the memory device. The self-refresh control logic block 220 controls the row circuit 720 to perform a self-refresh operation in an enable period of the self-refresh period signal SELF and a period from a moment when the self-refresh initiation signal SREF_ENTRY is enabled to a moment when the self-refresh termination signal SREF_EXIT is enabled.

The command decoding block 730 controls the operation of the row circuit 720 by decoding the command COMMAND applied to the memory device through a command buffer 701. When a command for starting a self-refresh operation is applied to the memory device, the command decoding block 730 decodes the command and enables the self-refresh initiation signal SREF_ENTRY. When a command for ending the self-refresh operation is applied to the memory device, the command decoding block 730 decodes the command and enables the self-refresh termination signal SREF_EXIT. Besides, as well known, the command decoding block 730 decodes diverse commands applied to the memory device, such as a read command, a write command, and an active command, and controls the internal circuits of the memory device.

The initial refresh control block 210, as described with reference to FIGS. 2 to 6, generates the self-refresh period signal SELF based on the reset signal RESETB and the clock enable signal CKE applied from the outside of the memory device through buffers 703 and 704.

The self-refresh control logic block 220 controls the row circuit 720 in the enable period of the self-refresh period signal SELF and the period from the moment when the self-refresh initiation signal SREF_ENTRY is enabled to the moment when the self-refresh termination signal SREF_EXIT is enabled so as to refresh the data stored in the cell array 710.

Out of a refresh period, the row circuit 720 performs a row operation, e.g., an active operation, onto the selected memory cells among the memory cells of the cell array 710 based on an address ADD inputted through an address buffer 702 under the control of the command decoding block 730. In a self-refresh period, the row circuit 720 sequentially refreshes the data stored in the cell array 710 under the control of the self-refresh control logic block 220.

According to the technology of the present invention, a self-refresh operation is performed in the initial operation period of a memory device. Therefore, the various internal circuits of the memory device operate in the initialization period and as a result, the internal circuits are stabilized.

While the present invention has been described with respect to the specific embodiments, it will be apparent to those skilled in the art that various changes and modifications may be made without departing from the spirit and scope of the invention as defined in the following claims.

What is claimed is:

1. A self-refresh control circuit for controlling a self-refresh operation of a memory device, comprising:
   a self-refresh control logic block configured to control the memory device to perform the self-refresh operation; and
   an initial refresh control block configured to activate the self-refresh control logic block in an initialization period of the memory device,
   wherein the initial refresh control block comprises:
      a pulse generation unit configured to generate a reset pulse wherein the reset pulse is activated when a reset signal is deactivated; and
      a self-refresh period signal generation unit configured to activate a self-refresh period signal in response to an activation of the reset pulse and deactivate the self-refresh period signal in response to the activation of a clock enable signal,
   wherein the self-refresh control logic block is activated in a period where the self-refresh period signal is activated.

2. The self-refresh control circuit of claim 1, wherein the self-refresh period signal generation unit comprises:
   a first signal generator configured to activate a first signal when the reset pulse is activated and the clock enable signal is deactivated;
   a second signal generator configured to activate a second signal when the reset signal is activated or the clock enable signal is deactivated; and
   a Set-Rest (SR) latch configured to activate the self-refresh period signal in response to the first signal and deactivate the self-refresh period signal in response to the second signal.

3. The self-refresh control circuit of claim 1, wherein the pulse generation unit comprises:
   an inversion delay line configured to invert and delay the reset signal to produce an inverted and delayed reset signal; and
   a reset pulse generation unit configured to generate and output the reset pulse by logically combining the inverted and delayed reset signal with the reset signal.

4. The self-refresh control circuit of claim 1, wherein the initialization period of the memory device includes a period from a power-up moment of the memory device to a moment when the memory device starts performing a synchronization operation.

5. The self-refresh control circuit of claim 1, wherein, after a power is supplied to the memory device and initial values of the memory device are set, the self-refresh control logic block is configured to control the memory device to perform the self-refresh operation before the memory device operates in synchronization with a reference clock.

6. A method for controlling a self-refresh operation of a memory device, comprising:
   starting a self-refresh operation in response to a reset signal for an initialization operation of the memory device; and
   ending the self-refresh operation in response to a clock enable signal for a synchronization operation of the memory device,
   wherein the reset signal includes a signal activated to set initial values of the memory device and deactivated for the initialization operation, and the clock enable signal includes a signal applied to the memory device for the synchronization operation.

7. A memory device, comprising:
   a cell array comprising a plurality of memory cells;
   a row circuit configured to control a row operation of the cell array;
   a command decoding block configured to generate a self-refresh initiation signal and a self-refresh termination signal by decoding a command;
   an initial refresh control block configured to generate a self-refresh period signal that is activated in an initialization period of the memory device; and
   a self-refresh control logic block configured to control the row circuit to perform a self- refresh operation in an activation period of the self-refresh period signal and a period from a moment when the self-refresh initiation signal is activated to a moment when the self-refresh termination signal is activated.

8. The memory device of claim 7, wherein the initial refresh control block is configured to activate the self-refresh period signal in response to a deactivation of a reset signal and deactivate the self-refresh period signal in response to an activation of a clock enable signal.

9. The memory device of claim 8, wherein the initial refresh control block comprises:
   a pulse generation unit configured to generate a reset pulse wherein the reset pulse is activated when the reset signal is deactivated; and
   a self-refresh period signal generation unit configured to activate the self-refresh period signal in response to an activation of the reset pulse and deactivate the self-refresh period signal in response to the activation of the clock enable signal.

10. The memory device of claim 7, wherein the initialization period of the memory device includes a period from a power-up moment of the memory device to a moment when the memory device starts performing a synchronization operation.

11. The memory device of claim 7, wherein, after a power is supplied to the memory device and initial values of the memory device are set, the self-refresh control logic block is configured to perform the self-refresh operation before a synchronization with a reference clock in response to an output from the initial refresh control block.

* * * * *